United States Patent
Zhang et al.

(10) Patent No.: US 9,799,555 B1
(45) Date of Patent: Oct. 24, 2017

(54) COBALT INTERCONNECTS COVERED BY A METAL CAP

(71) Applicant: GLOBALFOUNDRIES INC., Grand Cayman (KY)

(72) Inventors: Xunyuan Zhang, Albany, NY (US); Frank W. Mont, Troy, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/175,573

(22) Filed: Jun. 7, 2016

(51) Int. Cl.
*H01L 21/768* (2006.01)
*H01L 23/532* (2006.01)
*H01L 23/522* (2006.01)
*H01L 23/528* (2006.01)

(52) U.S. Cl.
CPC .... *H01L 21/76849* (2013.01); *H01L 21/7684* (2013.01); *H01L 21/76802* (2013.01); *H01L 21/76858* (2013.01); *H01L 21/76877* (2013.01); *H01L 21/76883* (2013.01); *H01L 23/528* (2013.01); *H01L 23/5226* (2013.01); *H01L 23/53209* (2013.01); *H01L 23/53228* (2013.01); *H01L 23/53257* (2013.01); *H01L 23/53266* (2013.01)

(58) Field of Classification Search
None
See application file for complete search history.

(56) References Cited

U.S. PATENT DOCUMENTS

| | | | |
|---|---|---|---|
| 9,576,901 B1* | 2/2017 | Chen | H01L 23/528 |
| 2014/0327140 A1* | 11/2014 | Zhang | H01L 23/528 257/751 |
| 2015/0179579 A1* | 6/2015 | Jezewski | H01L 21/76846 257/753 |
| 2016/0056076 A1* | 2/2016 | Edelstein | H01L 21/76879 438/627 |
| 2016/0197038 A1* | 7/2016 | Backes | H01L 21/76849 257/751 |

* cited by examiner

*Primary Examiner* — Stephen W Smoot
(74) *Attorney, Agent, or Firm* — Thompson Hine LLP

(57) ABSTRACT

Interconnects for a chip and methods of forming such interconnects. An opening is formed in a dielectric layer and a contact is formed in the opening. A metal cap is formed on a top surface of the contact. The contact is comprised of cobalt, and the metal cap covers the top surface of the contact.

11 Claims, 6 Drawing Sheets

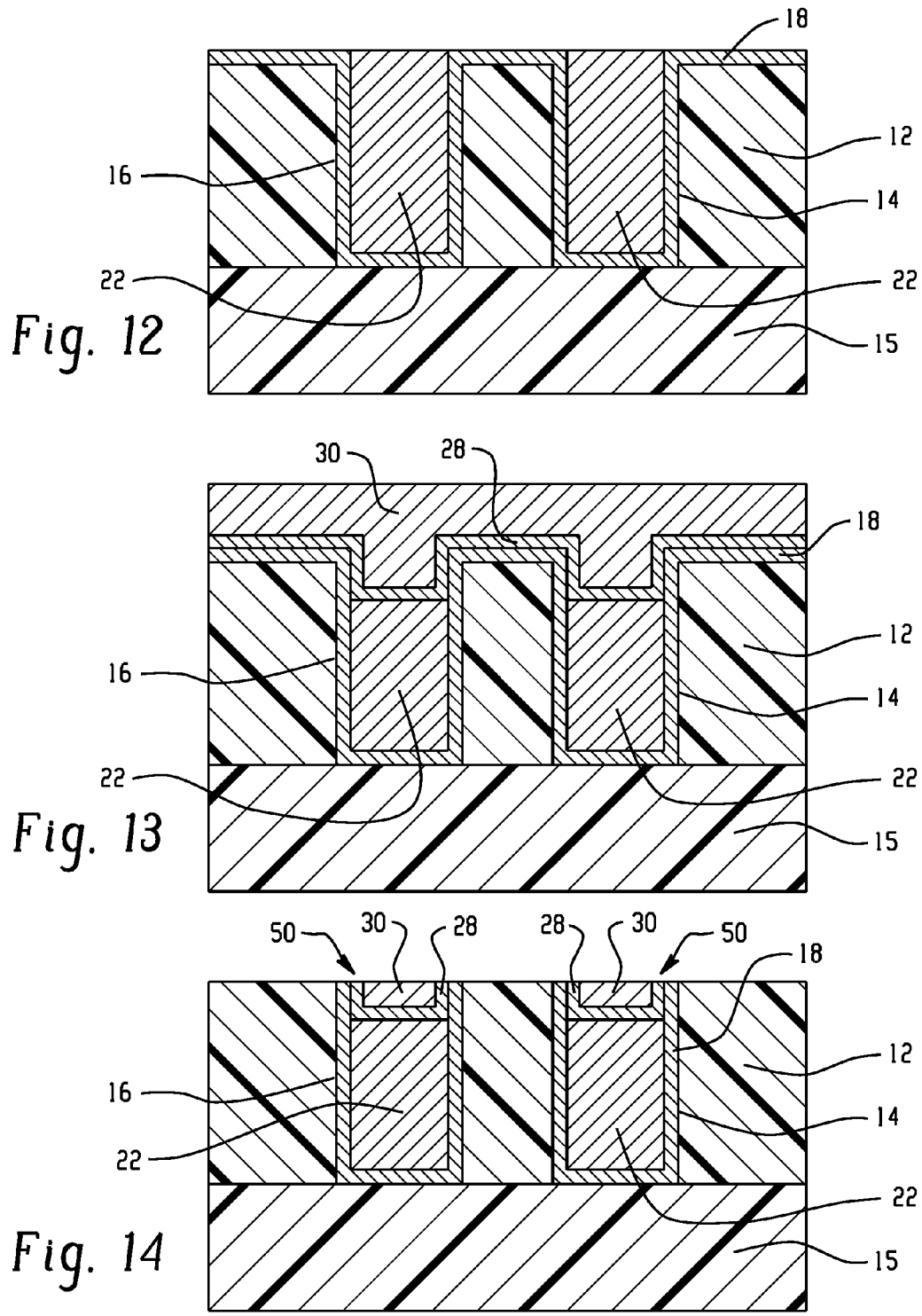

COBALT INTERCONNECTS COVERED BY A METAL CAP

BACKGROUND

The present invention relates to integrated circuits and semiconductor device fabrication and, more specifically, to interconnect structures for a chip and methods of forming such interconnect structures.

A back-end-of-line (BEOL) interconnect structure may be used to electrically connect device structures fabricated on a substrate by front-end-of-line (FEOL) processing. The BEOL interconnect structure may be formed using a dual damascene process in which via openings and trenches etching in a dielectric layer are simultaneously filled with metal to create a metallization level. In a via-first, trench-last dual damascene processing process in which a via opening is formed in a dielectric layer and then a trench is formed above the via opening, the via openings are unfilled during the etching process forming the trenches. In a single damascene process, the via openings and trenches are formed in different dielectric layers and filled separately with metal. The lowest metallization level of the BEOL interconnect structure may be coupled with the device structures by contacts formed using middle-of-line (MOL) processing. These contacts may be composed of cobalt, which may be prone to etching damage when forming the via openings and/or trenches of the lowest metallization level of the BEOL interconnect structure.

Improved interconnect structures for a chip and methods of forming such interconnect structures are needed.

SUMMARY

According to an embodiment of the invention, an interconnect structure includes a dielectric layer with an opening, a contact in the opening, and a metal cap on a top surface of the contact. The contact is comprised of cobalt and the metal cap covers the top surface of the contact.

According to another embodiment of the invention, a method includes forming an opening in a dielectric layer, forming a contact in the opening, and forming a metal cap on a top surface of the contact. The contact is comprised of cobalt, and the metal cap covers the top surface of the contact.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

FIGS. 12-14 are cross-sectional views of an interconnect structure at successive fabrication stages of a processing method in accordance with an alternative embodiment of the invention.

DETAILED DESCRIPTION

Figure 1:
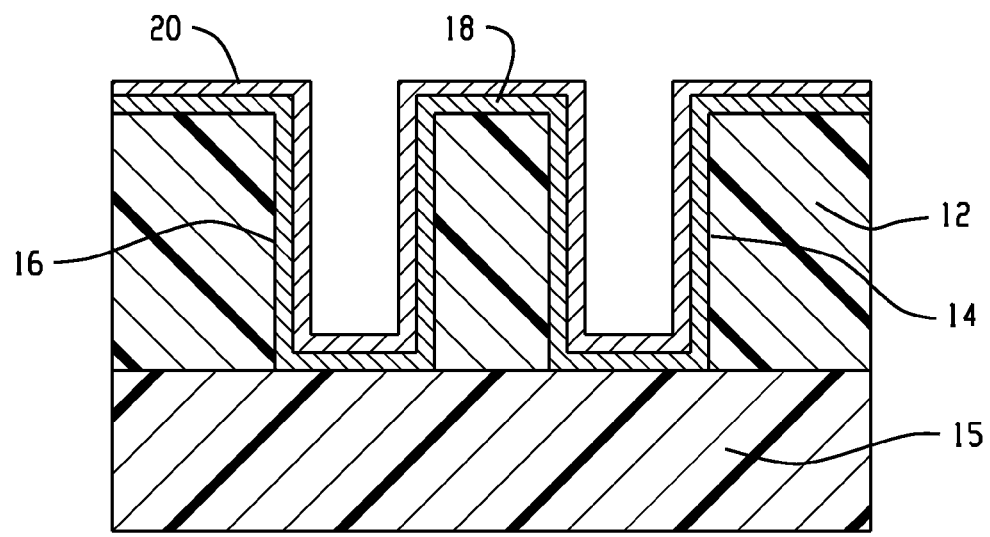
FIGS. 1-6 are cross-sectional views of an interconnect structure at successive fabrication stages of a processing method in accordance with an embodiment of the invention.

With reference to FIG. 1 and in accordance with an embodiment of the invention, a dielectric layer 12 is processed to form an interconnect structure of a metallization level 10. The dielectric layer 12 may be composed of an electrically-insulating dielectric material, such as a low-k dielectric material characterized by a relative permittivity or dielectric constant that is less than the dielectric constant of silicon dioxide ($SiO_2$), which is about 3.9. Candidate low-k dielectric materials for dielectric layer 12 include, but are not limited to, dense and porous organic low-k dielectrics, dense and porous inorganic low-k dielectric, such as organosilicate glasses, and combinations of such organic and inorganic dielectrics that are characterized by a dielectric constant of less than or equal to 3.0. In an alternative embodiment, the dielectric layer 12 may be composed of silicon dioxide deposited by chemical vapor deposition (CVD).

Openings, of which openings 14, 16 are representative, may be formed by photolithography and etching at selected locations distributed across the surface area of dielectric layer 12. Specifically, a resist layer may be applied, exposed to a pattern of radiation projected through a photomask, and developed to form a corresponding pattern of openings situated at the intended locations for the openings. The patterned resist layer is used as an etch mask for a dry etching process, such as a reactive-ion etching (RIE), that removes portions of the dielectric layer 12 to form the openings 14, 16. The etching process may be conducted in a single etching step or multiple etching steps with different etch chemistries, and may open onto an underlying feature, which is generally indicated by reference numeral 15, of a device structure. The feature 15 of the device structure may be the source, drain, or gate of a transistor, or the base, emitter, or collector of a bipolar junction transistor, formed on a substrate. The openings 14, 16 have respective sidewalls that extend from a top surface of the dielectric layer 12 to the feature 15 of the device structure. Alternatively, the feature 15 of the device structure may be a conductive feature in an underlying dielectric layer that is aligned with the openings 14, 16.

A barrier/liner layer 18 of a given thickness is deposited on the sidewalls and base of the openings 14, 16 and also in the field area on the top surface of the dielectric layer 12. The barrier/liner layer 18 may be comprised of ruthenium (Ru), titanium (Ti), titanium nitride (TiN), tantalum (Ta), tantalum nitride (TaN), or a multilayer combination of these materials (e.g., a TaN/Ru bilayer with Ru as the topmost layer) deposited by physical vapor deposition (PVD) with, for example, a sputtering process.

A layer 20 of a given thickness may be formed on the barrier/liner layer 18 inside of the openings 14, 16, and in the field area on the top surface of the dielectric layer 12. The layer 20 is comprised of cobalt and may be formed by physical vapor deposition (PVD) or by chemical vapor deposition (CVD) using a cobalt-containing precursor, such as a cobalt-containing carbonyl precursor, as a reactant. In an embodiment, the cobalt in the layer 20 may be elemental cobalt with small additions of trace impurities. In an embodiment, the layer 20 does not include tungsten (W) in its composition.

Figure 2:
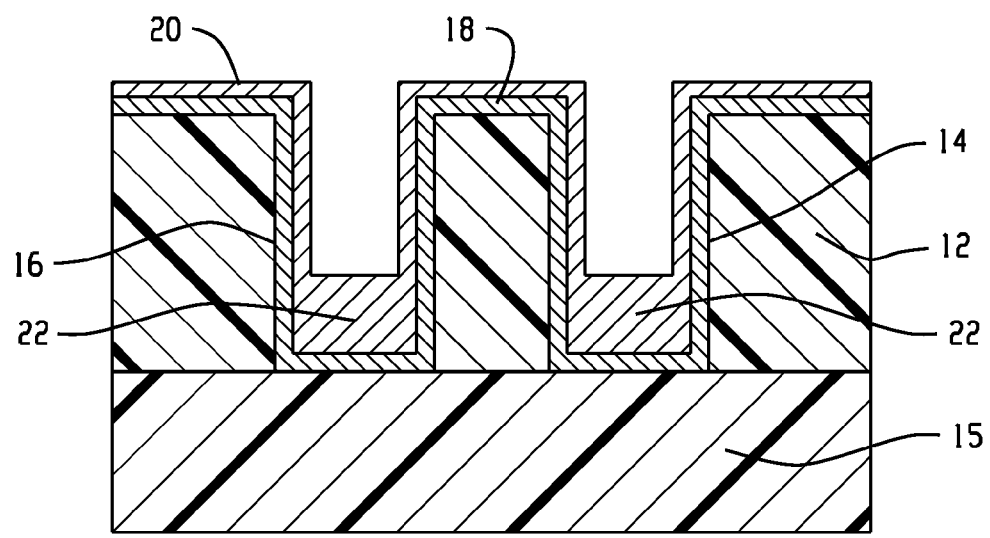

With reference to FIG. 2 in which like reference numerals refer to like features in FIG. 1 and at a subsequent fabrication stage, a thermal anneal is applied to cause deposited cobalt in the field area on the top surface of the dielectric layer 12 to reflow into the openings 14, 16. The cobalt received within the openings 14, 16 increases the thickness of the cobalt contacts 22 by increasing the depth of the cobalt inside the openings 14, 16. The thermal anneal may comprise heating to a temperature, for example a temperature of 400° C., in a reducing atmosphere, such as an atmosphere containing hydrogen. The thermal anneal accelerates cobalt surface diffusion, particularly from the field area on the top surface of the dielectric layer 12, and increases the fill depth upward from the bottom of the openings 14, 16. The reflow is characterized as partial because, despite the thermally-induced transport of cobalt from the field area into the openings 14, 16, a residual thickness of the cobalt layer 20 remains in the field area and on the sidewalls of the openings 14, 16 following the thermal anneal. In an embodiment, the reflow process may be enhanced by the use of ruthenium as the barrier/liner layer 18 or as the topmost layer of a multilayer combination serving as the barrier/liner layer 18.

Figure 3:
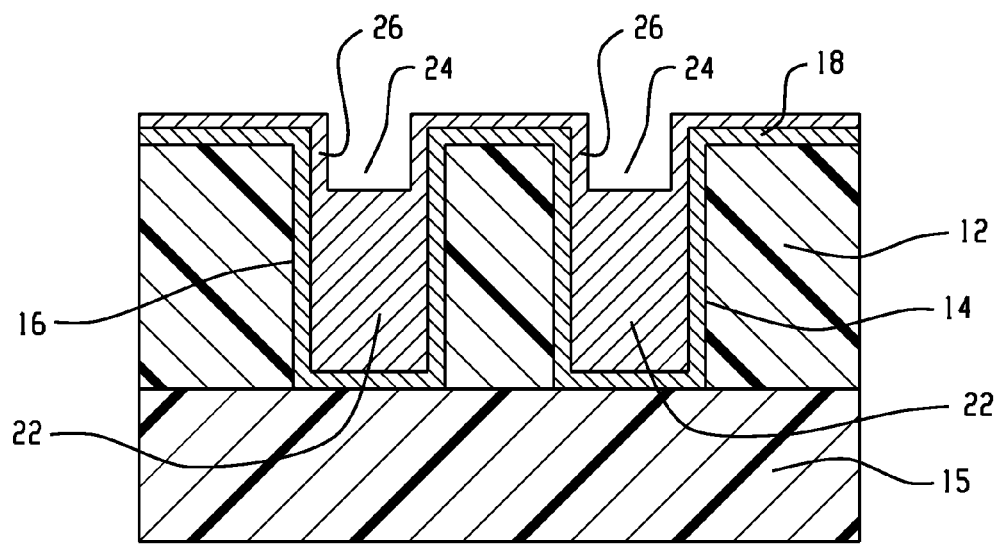

With reference to FIG. 3 in which like reference numerals refer to like features in FIG. 2 and at a subsequent fabrication stage, the cobalt deposition and partial reflow process is repeated by one or more iterations of depositing a cobalt layer like layer 20 and reflowing the cobalt from each of those layers into the openings 14, 16 to build the contacts 22. As a result of the repetition of the cobalt deposition and partial reflow process, the height or level of cobalt incrementally rises inside the openings 14, 16 and eventually is located proximate to the entrance to the openings 14, 16. Following the final deposition/partial reflow sequence, the top surface of each cobalt contact 22 includes a recess 24, which may be centrally located relative to the sidewalls of the openings 14, 16 and recessed slightly relative to the adjacent top surface of the dielectric layer 12. A residual layer 26 of cobalt is located on the sidewalls of the openings 14, 16 above each respective contact 22 and on the barrier/liner layer 18 adjacent to the associated recess 24. The cobalt constituting the residual layer 25 may be oxidized, at least in part, by air exposure.

Figure 4:
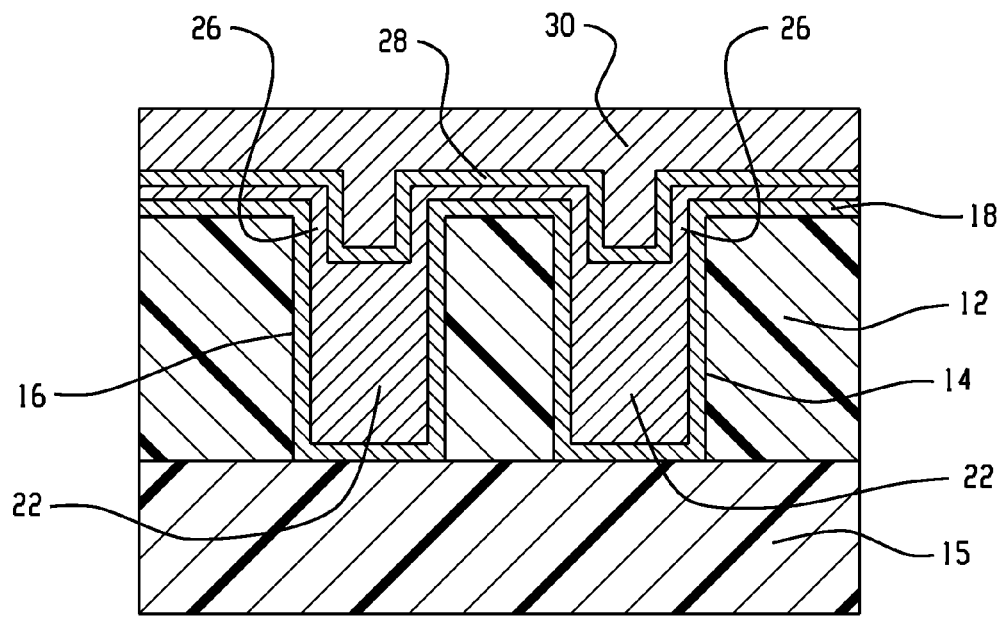

With reference to FIG. 4 in which like reference numerals refer to like features in FIG. 3 and at a subsequent fabrication stage, a seed layer 28 is formed that covers at top surface of the cobalt contacts 22 inside the openings 14, 16 and that also covers the top surface of the dielectric layer 12 in the field area. The seed layer 28 may be comprised of elemental copper (Cu) and a second element, such as manganese (Mn) in a co-deposited copper-manganese (Cu—Mn) alloy or aluminum (Al) in a co-deposited copper-aluminum (Cu—Al) alloy, that is deposited by physical vapor deposition (PVD) with, for example, a sputtering process. After the deposition of the seed layer 28, a thicker metal layer 30 comprised of a low-resistivity metal, such as copper, may be deposited using a deposition process, such as electroplating or another electrochemical plating process, different than the deposition process used to deposit the seed layer 28. The seed layer 28 may be required to carry the electrical current needed to initiate an electroplating process forming the metal layer 30. Respective residual portions of the seed layer 28 and metal layer 30 are located in the recess 24 at the top surface of the respective cobalt contact 22 in each of the openings 14, 16.

Figure 5:
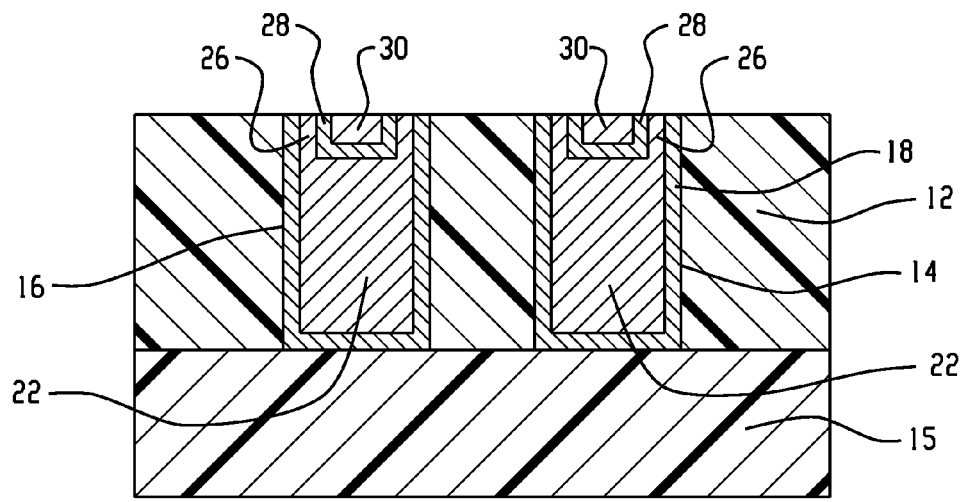

With reference to FIG. 5 in which like reference numerals refer to like features in FIG. 4 and at a subsequent fabrication stage, the metal layer 30 and the seed layer 28 are removed from the field area on the top surface of dielectric layer 12 by planarization, such as with a chemical mechanical polishing (CMP) process. The cobalt-containing layer 26 in the field area on the top surface of dielectric layer 12 may then be removed by planarization, such as with a different chemical mechanical polishing (CMP) process. The barrier/liner layer 18 in the field area on the top surface of dielectric layer 12 may then be removed by planarization, such as with a different chemical mechanical polishing (CMP) process. Material removal during each chemical mechanical polishing (CMP) process combines abrasion and an etching effect that polishes the targeted material at the submicron level. Each chemical mechanical polishing process may be conducted with a commercial tool using standard polishing pads and slurries selected to polish the targeted material.

Following planarization, portions of the residual layer 26 of cobalt are located between the residual portions of the seed layer 28 and metal layer 30 and the barrier/liner layer 18 on the sidewalls of the respective openings 14, 16. The residual portions of the cobalt layer 26, seed layer 28, and metal layer 30 are located closer to the entrance to the openings 14, 16 than the cobalt contacts 22.

Figure 6:
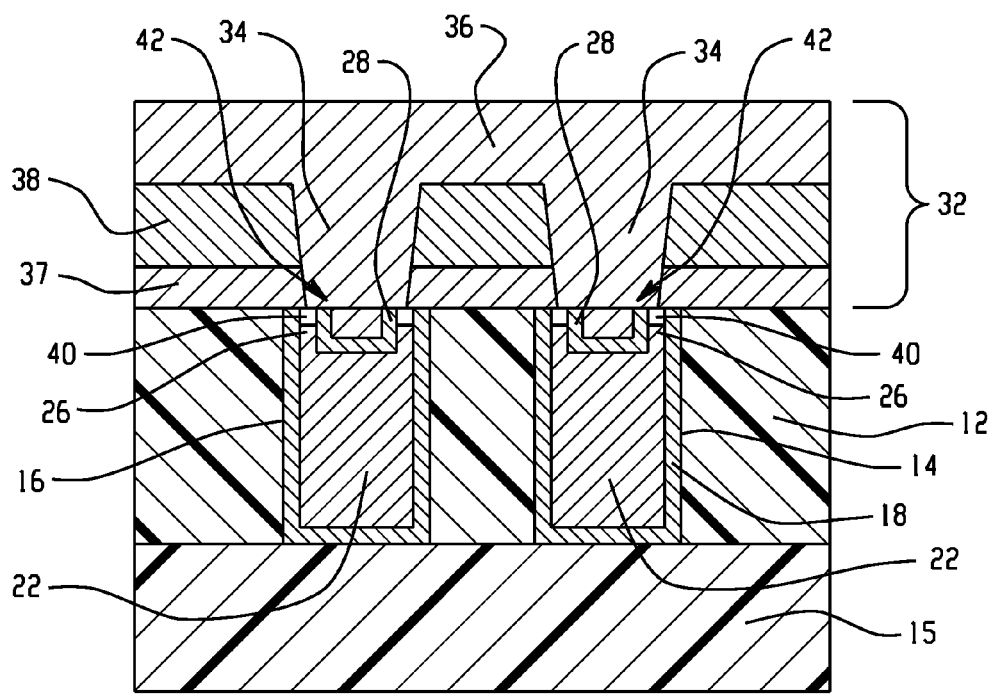

With reference to FIG. 6 in which like reference numerals refer to like features in FIG. 5 and at a subsequent fabrication stage, a metallization level 32 may be formed on the dielectric layer 12 by a back-end-of-line (BEOL) process. Additional metallization levels (not shown) may be subsequently formed on the metallization level 32. Conductive features in the different metallization levels function to interconnect devices of an integrated circuit and may provide circuit-to-circuit connections, or may establish contacts with input and output terminals.

In the metallization level 32, vias 34 and a wire 36 are located in dielectric layers 37, 38 and may be formed by a single damascene process or by a dual damascene process. To that end, via openings and a trench are defined in the dielectric layers 37, 38 by photolithography and etching, and the via openings and trench are filled by a conductor, such as copper, that is polished to form the vias 34 and wire 36.

During the processes forming the metallization level 32, thermal effects cause an element (e.g., manganese or aluminum), other than copper, in the residual portion of the seed layer 28 located in the recesses 24 to diffuse into the adjacent residual cobalt layer 26. The diffusion may be preferentially directed toward the metallization level 32. The diffusing element may displace the cobalt of the residual layer 26 to form cobalt-depleted regions 40 that are located between the seed layer 28 and metal layer 30 in the recess 24 and the barrier/liner layer 18 on the closest sidewall of the respective openings 14, 16. In an embodiment, the depletion of the cobalt in the cobalt-depleted regions 40 may be complete such that the regions 40 are composed entirely of the element (e.g., manganese or aluminum) originating from the seed layer 28 and are free of cobalt.

The cobalt-depleted regions 40, along with the seed layer 28 and metal layer 30 located in the recesses 24, collectively form composite metal caps 42 on respective top surfaces of the cobalt contacts 22. The metal caps 42 may extend across the entire width and length (i.e., cover the entire surface area) of the respective top surfaces of the cobalt contacts 22. The metal cap 42 inside opening 14 may be coextensive at its perimeter with the sidewalls of opening 14 so that the top surface of the cobalt contact 22 inside opening 14 is fully or completely covered. Similarly, the metal cap 42 inside opening 16 may be coextensive at its perimeter with the sidewalls of opening 16 so that the top surface of the cobalt contact 22 inside opening 16 is completely covered. Alternatively, the metal caps 42 may cover almost all (e.g., greater than 90%) of the surface area of the respective top surfaces of the cobalt contacts 22.

The metal caps 42 operate as protection layers that improve the compatibility of the cobalt contacts 22 with etching and cleaning processes used in damascene processes. Instead of landing on the top surface of the cobalt contacts 22, the vias 34 land on the intervening metal caps 42. The metal caps 42 cover and protect the cobalt contacts 22 during the process forming the via openings for the vias 34 and possibly the process forming the trench for the wire 36. In particular, the cobalt contacts 22 are protected by the metal caps 42 during reactive ion etching and wet chemical cleaning (e.g., dilute hydrofluoric (DHF) or buffered hydrofluoric (BHF)) associated with the formation of the via openings for the vias 34 and possibly the trench for the wire 36. This protection preserves the integrity of the cobalt contacts 22 by preventing any etching of the cobalt contacts 22, and also permits normal etching and cleaning processes of record to be used. Processes that would otherwise etch the cobalt contained in the contacts 22 do not have to be avoided because the metal caps 42 have a different etch selectivity (i.e., etch at a lower rate) than the contacts 22. In the end structure, the metal caps 42 are electrically conductive such that the capped contacts 22 are electrically coupled in a path of low electrical resistance with the vias 34.

Figure 7:
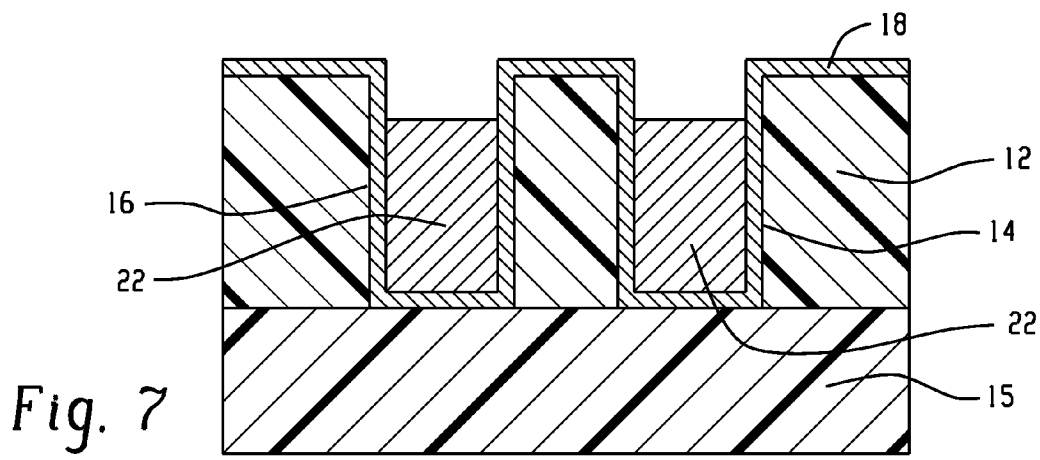
FIGS. 7-9 are cross-sectional views of an interconnect structure at successive fabrication stages of a processing method in accordance with an alternative embodiment of the invention.

With reference to FIG. 7 in which like reference numerals refer to like features in FIG. 1 and at a subsequent fabrication stage in accordance with an alternative embodiment, the cobalt contacts 22 may be formed using a thermal anneal that causes deposited cobalt in the field area to completely reflow into the openings 14, 16 in the dielectric layer 12. The thermal anneal may comprise heating to a temperature of, for example, 400° C. in a reducing atmosphere, such as an atmosphere containing hydrogen. The deposition and reflow process may be repeated as needed to fill the openings 14, 16. As a result of the repetition of the cobalt deposition and partial reflow process, the height or level of cobalt incrementally rises inside the openings 14, 16 and eventually is located proximate to the entrance to the openings 14, 16. In this embodiment, the reflow is characterized as full because, following each sequential cycle of cobalt deposition and subsequent reflow, the cobalt layer 20 may be completely removed from the field area. The residual layer 26 of cobalt is also missing from the field area on the top surface of the dielectric layer 12 after the contacts 22 are built as a result of the full reflow of the cobalt layers 20. In an embodiment, the reflow process may be enhanced by the use of ruthenium as the barrier/liner layer 18 or as the topmost layer of a multilayer combination serving as the barrier/liner layer 18.

Following the final reflow process that has achieved the desired thickness, the cobalt contacts 22 are recessed slightly relative to the entrances to the openings 14, 16 and relative to the adjacent top surface of the dielectric layer 12. The recessing may be provided through control over the number of deposition and reflow processes.

Figure 8:
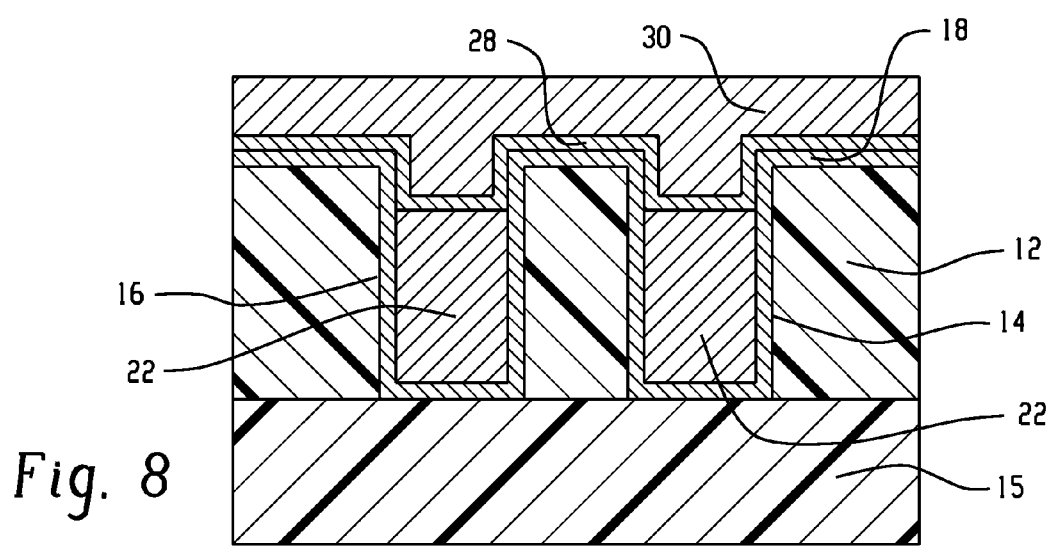

With reference to FIG. 8 in which like reference numerals refer to like features in FIG. 7 and at a subsequent fabrication stage, the seed layer 28 is formed that covers the cobalt contacts 22, the sidewalls of the openings 14, 16, and the field area on the top surface of the dielectric layer 12. The seed layer 28 may be comprised of elemental copper (Cu) or a co-deposited alloy containing copper deposited by physical vapor deposition (PVD) with, for example, a sputtering process. Due to the absence of the residual layer 26 of cobalt, the seed layer 28 does not require, in addition to copper, a co-deposited element capable of forming the cobalt-depleted regions 40. After the deposition of the seed layer 28, the thicker metal layer 30 may be deposited using a deposition process, such as electroplating or another type of electrochemical plating process. Alternatively, the metal layer 30 may be deposited with an electroless deposition process, which would permit the seed layer 28 to be omitted. A portion of the metal layer 30 forms inside the openings 14, 16 at a location above the cobalt contacts 22.

Figure 9:
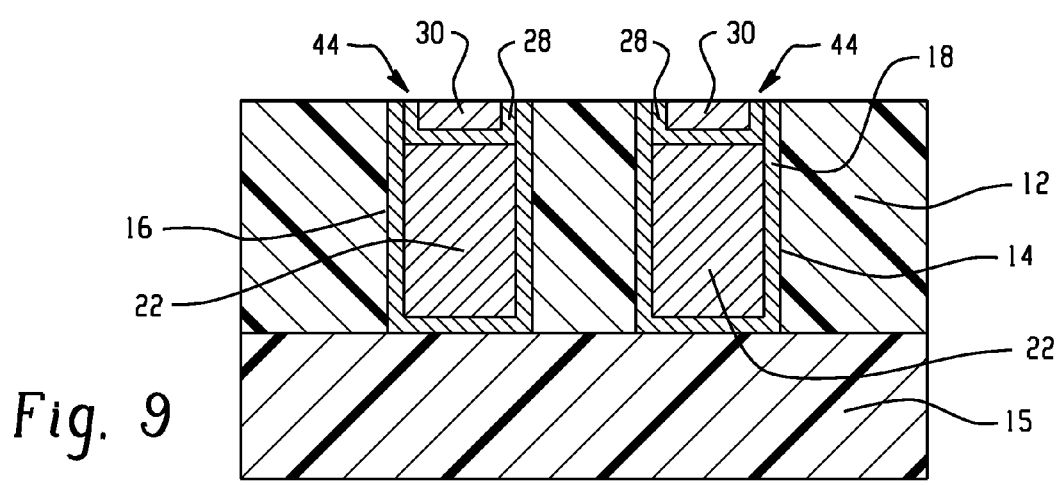

With reference to FIG. 9 in which like reference numerals refer to like features in FIG. 8 and at a subsequent fabrication stage, the metal layer 30 and seed layer 28 in the field area on the top surface of dielectric layer 12 is removed by planarization, such as with a chemical mechanical polishing (CMP) process. The barrier/liner layer 18 in the field area on the top surface of dielectric layer 12 is also removed by planarization, such as with a different chemical mechanical polishing (CMP) process. A cobalt planarization process is not required in this embodiment due to the absence of cobalt on the top surface of the dielectric layer 12 resulting from the full reflow. Following polishing, the metal layer 30 and optional seed layer 28 fill the open space inside the openings 14, 16 not already occupied by the contacts 22.

Metal caps 44 comprised of respective residual portions of the seed layer 28 and metal layer 30 are located and embedded in each of the openings 14, 16 at a location above the top surface of the respective cobalt contact 22. The metal caps 44, which are comprised entirely of the material from the seed layer 28 and metal layer 30, may cover the entire width and length (i.e., surface area) of the respective top surface of each of the cobalt contacts 22. The metal cap 44 inside opening 14 may be coextensive at its perimeter with the sidewall of opening 14 so that the top surface of the cobalt contact 22 inside opening 14 is completely covered. Similarly, the metal cap 44 inside opening 16 may be coextensive at its perimeter with the sidewalls of opening 16 so that the top surface of the cobalt contact 22 inside opening 16 is completely covered. Alternatively, the metal caps 44 may cover almost all (e.g., greater than 90%) of the surface area of the respective top surfaces of the cobalt contacts 22. Because of the prior planarization, the top surface of the metal caps 44 may be coplanar with the adjacent top surface of the dielectric layer 12.

The fabrication process then continues as in FIG. 6 to form the vias 34 and wire 36, and in which the metal caps 44 protect the underlying cobalt contacts 22 against etching when the via openings are formed. Because the formation of the cobalt contacts 22 process relies on the use of a thicker cobalt layer that is planarized, the metal caps 44 do not require the cobalt-depleted regions 40 in order to cover the cobalt contacts 22. Instead of landing on the unprotected top surface of the cobalt contacts 22, the vias 34 land on the intervening metal caps 44 that function as a protective layer for the underlying cobalt contacts 22. In the end structure, the metal caps 44 are electrically conductive such that the capped contacts 22 are electrically coupled in a path of low electrical resistance with the vias 34.

Figure 10:
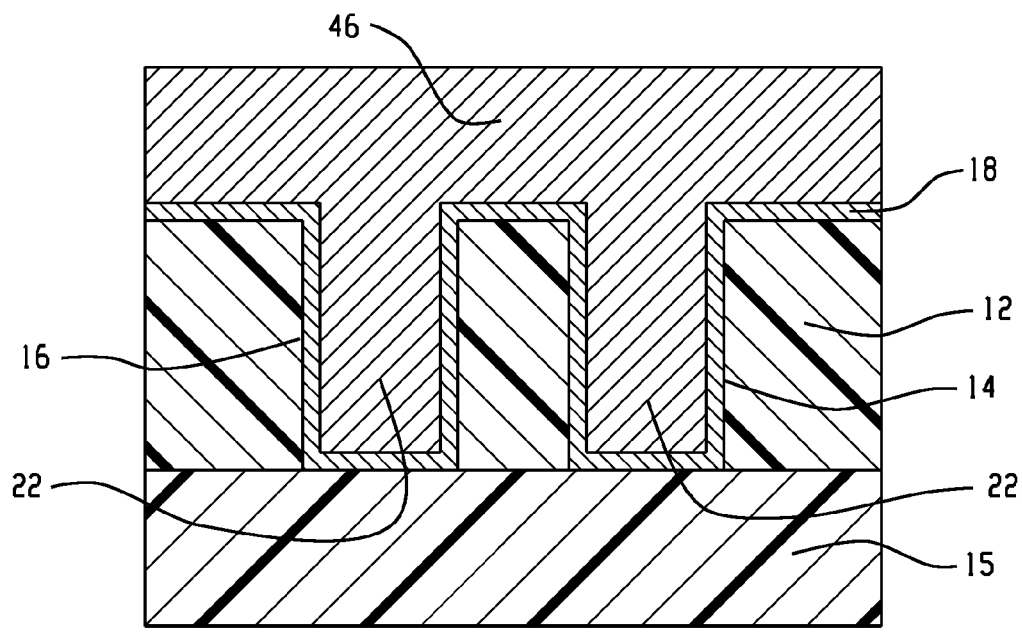
FIGS. 10-11 are cross-sectional views of an interconnect structure at successive fabrication stages of a processing method in accordance with an alternative embodiment of the invention.

With reference to FIG. 10 in which like reference numerals refer to like features in FIG. 1 and at a subsequent fabrication stage in accordance with an alternative embodiment, a cobalt layer 46 may be deposited that fills the openings 14, 16 and that includes thickened coverage of field areas on the top surface of the dielectric layer 12. In an embodiment, the layer 46 may be deposited without the necessity of either partial or full reflow of thin cobalt layers.

The top surface of the cobalt layer 46 may include topology resulting from the presence of the openings that is not visible in FIG. 10.

Figure 11:
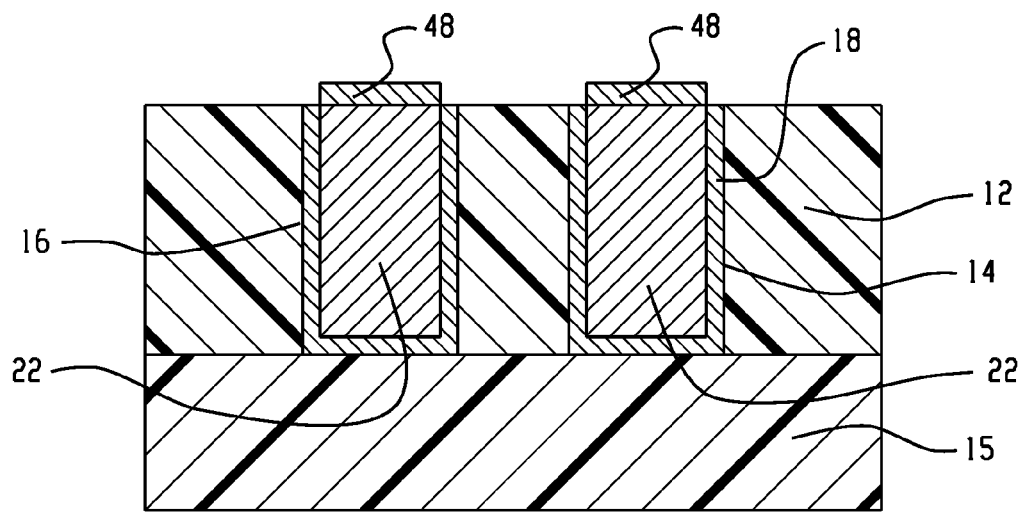

With reference to FIG. 11 in which like reference numerals refer to like features in FIG. 10 and at a subsequent fabrication stage, the cobalt layer 46 in the field area on the top surface of the dielectric layer 12 is removed by planarization, such as with a chemical mechanical polishing (CMP) process. The barrier/liner layer 18 in the field area on the top surface of dielectric layer 12 is also removed by planarization, such as with a different chemical mechanical polishing (CMP) process. The top surfaces of the cobalt contacts 22 and the dielectric layer are exposed following the planarization.

A metal cap 48 is formed on the top surface of each cobalt contact 22 by selective deposition with, for example, chemical vapor deposition (CVD), which entails inducing a chemical reaction between a metal precursor and a co-reactant gas in the vicinity of the top surfaces of the cobalt contacts 22. A solid reaction product is selectively deposited to form the metal caps 48, but the reaction product does not form on the top surface of the dielectric layer 12 adjacent to the cobalt contacts 22. The deposition conditions may be selected to provide a thin film that is highly conductive (i.e., low electrical resistance) and that exhibits good adhesion to cobalt without depositing on dielectric surfaces. In particular, the conductor in the metal caps 48 may be composed of ruthenium (Ru) or a ruthenium-containing material, such as ruthenium oxide ($RuO_x$), formed using a volatile metal precursor of ruthenium and an optional co-reactant gas, such as oxygen ($O_2$), nitric oxide (NO), or nitrous oxide ($N_2O$), deposited by low-temperature chemical vapor deposition (CVD).

The metal caps 48 may cover the entire width and length (i.e., surface area) of the respective top surface of each of the cobalt contacts 22. The metal cap 48 on the contact 22 inside opening 14 may be coextensive at its perimeter with the sidewalls of opening 14 so that the top surface of the cobalt contact 22 inside opening 14 is completely covered. Similarly, the metal cap 48 on the contact 22 inside opening 16 may be coextensive at its perimeter with the sidewalls of opening 16 so that the top surface of the cobalt contact 22 inside opening 16 is completely covered. Alternatively, the metal caps 48 may cover almost all (e.g., greater than 90%) of the surface area of the respective top surfaces of the cobalt contacts 22.

The metal caps 48 may project above the adjacent top surface of the dielectric layer 12. Alternatively, due to recessing of the cobalt contacts during planarization, the metal caps 48 may be partially recessed relative to the adjacent top surface of the dielectric layer 12 or may be coplanar with the adjacent top surface of the dielectric layer 12.

The fabrication process then continues as in FIG. 6 to form the vias 34 and wire 36, and in which the metal caps 48 protect the underlying cobalt contacts 22 against etching when the via openings are formed. Instead of landing on the unprotected top surface of the cobalt contacts 22, the vias 34 land on the intervening metal caps 48 that function as protective layers. Because the formation of the cobalt contacts 22 process relies on the use of a thicker cobalt layer that is planarized, the metal caps 44 do not require the cobalt-depleted regions 40 in order to cover and preferably fully cover the cobalt contacts 22. In the end structure, the metal caps 48 are electrically conductive such that the capped contacts 22 are electrically coupled in a path of low electrical resistance with the vias 34.

With reference to FIG. 12 in which like reference numerals refer to like features in FIG. 10 and at a subsequent fabrication stage in accordance with an alternative embodiment, the cobalt contacts 22 may be defined by planarization, such as with a chemical mechanical polishing (CMP) process, that removes the cobalt layer 46 from the field area on the top surface of dielectric layer 12 and leaves the portions of the cobalt layer 46 inside the openings 14, 16. The planarization may vertically stop on the residual barrier/liner layer 18 in the field area. The top surfaces of the cobalt contacts 22 are exposed following the planarization, and may be coplanar with the adjacent top surface of the barrier/liner layer 18.

With reference to FIG. 13 in which like reference numerals refer to like features in FIG. 12 and at a subsequent fabrication stage, the cobalt contacts 22 are recessed by, for example, etching with a reactive ion etching or an acid-based wet chemical process that removes cobalt selective to (i.e., at a higher rate than) the material of the residual barrier/liner layer 18. The residual barrier/liner layer 18 covers and protects the field area of the dielectric layer 12 during this etching process. A seed layer 28 is formed that covers a top surface of each of the cobalt contacts 22, and that also covers the residual barrier/liner layer 18 inside the openings 14, 16 and in the field area on the top surface of the dielectric layer 12. The seed layer 28 may be comprised of elemental copper (Cu) or a co-deposited alloy containing copper deposited by physical vapor deposition (PVD) with, for example, a sputtering process. The seed layer 28 does not require co-deposition to provide an element capable of forming the cobalt-depleted regions 40. After the deposition of the seed layer 28, the thicker metal layer 30 may be deposited using a deposition process, such as electroplating or another electrochemical plating process. The metal layer 30 may be deposited with an electroless deposition process that permits the seed layer 28 to be omitted.

A portion of the metal layer 30 forms inside the openings 14, 16 at a location above the recessed top surface of the cobalt contacts 22. The metal layer 30 and optional seed layer 28 fill the open space inside the openings 14, 16 not already occupied by the cobalt contacts 22.

With reference to FIG. 14 in which like reference numerals refer to like features in FIG. 13 and at a subsequent fabrication stage, the metal layer 30 and seed layer 28 are removed from the field area on the top surface of the dielectric layer 12 by planarization, such as with a chemical mechanical polishing (CMP) process. The residual barrier/liner layer 18 is also removed from the field area on the top surface of the dielectric layer 12 by planarization, such as with a different chemical mechanical polishing (CMP) process.

Metal caps 50 comprised of respective residual portions of the seed layer 28 and metal layer 30 are located inside the openings 14, 16 at locations above the recessed top surfaces of the respective cobalt contacts 22. The cobalt contacts 22 may be fully or completely covered by the metal caps 50. The metal caps 50 extend across the entire width and length (i.e., surface area) of the respective top surface of each of the cobalt contacts 22. The metal cap 50 on the contact 22 inside opening 14 may be coextensive at its perimeter with the sidewalls of opening 14 so that the top surface of the cobalt contact 22 inside opening 14 is completely covered. Similarly, the metal cap 44 on the contact 22 inside opening 16 may be coextensive at its perimeter with the sidewalls of opening 16 so that the top surface of the cobalt contact 22 inside opening 16 is completely covered. Alternatively, the metal caps 50 may cover almost all (e.g., greater than 90%) of the surface area of the respective top surfaces of the cobalt contacts 22.

The process then continues as in FIG. 6 to form the vias 34 and wire 36, and in which the metal caps 50 protect the underlying cobalt contacts 22 against etching when the via openings and possibly the trench are formed. Instead of landing on the unprotected top surface of the cobalt contacts 22, the openings for vias 34 land on the intervening metal caps 50. In the end structure, the metal caps 50 are electrically conductive such that the capped contacts 22 are electrically coupled in a path of low electrical resistance with the vias 34.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refers to a direction perpendicular to the horizontal, as just defined. The term "lateral" refers to a direction within the horizontal plane. Terms such as "above" and "below" are used to indicate positioning of elements or structures relative to each other as opposed to relative elevation.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An interconnect structure comprising:
    a dielectric layer including an opening with a sidewall;
    a contact in the opening, the contact comprised of cobalt; and
    a metal cap on a top surface of the contact, the metal cap covering the top surface of the contact,
    wherein the metal cap includes a first component and a second component that is located between the first component and the sidewall of the opening, the first component of the metal cap is comprised of a first material, the second component of the metal cap is comprised of a second material that is different in composition from the first material, the first material is primarily comprised of copper, and the second material is primarily comprised of manganese or aluminum.

2. The interconnect structure of claim 1 wherein the top surface of the contact is recessed relative to a top surface of the dielectric layer, and the metal cap is located inside the opening and has a top surface that is coplanar with a top surface of the dielectric layer.

3. The interconnect structure of claim 1 wherein the first material and the second material are free of cobalt.

4. The interconnect structure of claim 1 wherein the top surface of the contact is recessed relative to a top surface of the dielectric layer, and the metal cap is located inside the opening.

5. The interconnect structure of claim 1 wherein the metal cap fully covers the top surface of the contact.

6. A method comprising:
    forming an opening in a dielectric layer;
    forming a contact in the opening; and
    forming a metal cap on a top surface of the contact,
    wherein the contact is comprised of cobalt, the metal cap covers the top surface of the contact, the metal cap includes a first component and a second component that is located between the first component and a sidewall of the opening, the first component of the metal cap is comprised of a first material, the second component of the metal cap is comprised of a second material that is different in composition from the first material, the first material is primarily comprised of copper, and the second material is primarily comprised of manganese or aluminum.

7. The method of claim 6 wherein forming the contact in the opening comprises:
    partially filling the opening with cobalt,
    wherein the top surface of the contact is recessed relative to a top surface of the dielectric layer.

8. The method of claim 7 wherein forming the metal cap on the top surface of the contact comprises:
    depositing at least one layer comprised of copper inside a recess in the top surface of the contact in order to form the first component of the metal cap; and
    thermally diffusing atoms of manganese or aluminum from the at least one layer to form the second component of the metal cap.

9. The method of claim 8 further comprising:
    forming at least one metallization level on the top surface of the dielectric layer,
    wherein the atoms of manganese or aluminum are thermally diffused by thermal effects when the at least one metallization level is formed.

10. The method of claim 6 wherein the metal cap fully covers the top surface of the contact.

11. The method of claim 8 wherein the first component and the second component are free of cobalt.

* * * * *